United States Patent [19]  [11] 4,231,055
Iizuka  [45] Oct. 28, 1980

[54] COMPLEMENTARY MOS TRANSISTORS WITHOUT AN ISOLATION REGION

[75] Inventor: Tetsuya Iizuka, Kawasaki, Japan

[73] Assignee: Tokyo Shibaura Denki Kabushiki Kaisha, Kawasaki, Japan

[21] Appl. No.: 957,443

[22] Filed: Nov. 3, 1978

[30] Foreign Application Priority Data

Nov. 16, 1977 [JP] Japan ................................ 52/137649
Nov. 16, 1977 [JP] Japan ................................ 52/137650
Nov. 22, 1977 [JP] Japan ................................ 52/140204

[51] Int. Cl.² ...................... H01L 27/02; H01L 29/78
[52] U.S. Cl. ...................................... 357/42; 357/23; 357/89
[58] Field of Search ............................ 357/23, 41, 42

[56] References Cited

U.S. PATENT DOCUMENTS

| 3,840,888 | 10/1974 | Gaensslen et al. | 357/42 |
|---|---|---|---|
| 3,893,155 | 7/1975 | Ogiue | 357/42 |
| 4,131,907 | 12/1978 | Ouyang | 357/42 |
| 4,152,717 | 5/1979 | Satou et al. | 357/42 |

OTHER PUBLICATIONS

IPRI "Lambda Diodes Utilizing an Enhancement-Depletion C MOS/SOS Process" IEEE Trans. Electron Devices vol. ED-24 pp. 7-12.

Primary Examiner—Gene M. Munson
Attorney, Agent, or Firm—Oblon, Fisher, Spivak, McClelland & Maier

[57] ABSTRACT

A first semiconductor region of P⁻ type is formed in a semiconductor substrate of N⁻ types. The N⁻ region adjacent to the first semiconductor region is a second semiconductor region. A third semiconductor region of N⁺ type and a fourth semiconductor region of P⁺ type are formed on the first and second semiconductor regions, respectively. Between the first semiconductor region and fourth semiconductor region is formed a first channel region which includes a subregion of P⁻ type and a fifth semiconductor region of N types. Between the second semiconductor region and third semiconductor region is formed a second channel region which includes a subregion of N⁻ type and a sixth semiconductor region of P type. The fourth semiconductor region, the subregion of the first channel region and the sixth semiconductor region are used for a P-channel MOS transistor. The third semiconductor region, the subregion of the second channel region and the fifth semiconductor region are used for an N-channel MOS transistor.

10 Claims, 17 Drawing Figures

COMPLEMENTARY MOS TRANSISTORS WITHOUT AN ISOLATION REGION

BACKGROUND OF THE INVENTION

This invention relates to a complementary MOS transistor allowing for high density integration.

FIG. 1 shows a memory cell circuit which has the smallest number of elements among the known memory cell arrangements of a static semiconductor memory dvice dispensing with a refreshing operation. The memory cell of FIG. 1 comprises a first N channel depletion type (D type) MOS transistor $T_1$, one terminal (drain) of which is connected to one power source $V_{DD}$; a third P channel D type MOS transistor $T_3$, one terminal (drain) of which is connected to the other power source $V_{SS}$ (grounding potential); a second N channel D type MOS transistor $T_2$ connected between the other terminals (sources) of the first and third MOS transistors $T_1$, $T_3$; and a fourth MOS transistor $T_4$ which is connected between the junction of the first and second MOS transistors $T_1$, $T_2$ and a bit line BL, and whose gate is connected to a word line WL to act as a transfer gate. The gates of the first MOS transistor $T_1$ and the third MOS transistor $T_3$ are connected to the junction of the first and second MOS transistors. The gate of the second MOS transistor $T_2$ is connected to the second power source $V_{SS}$. Two stability phases corresponding to the logic levels "0" and "1" are produced at the junction of the first and second MOS transistors $T_1$, $T_2$ owing to negative resistances of the MOS transistors T1 and T2.

The above-mentioned memory cell comprises N- and P-type MOS transistors referred to as "complementary MOS transistors" (abbreviated as CMOS). FIG. 2 schematically shows a cross section of a prior CMOS inverter. The gates of a P channel transistor $T_P$ and an N channel transistor $T_N$ are jointly connected to constitute an input terminal IN, and the drains of both transistors $T_P$, $T_N$ are jointly connected to form an output terminal OUT, thus providing a CMOS inverter. This CMOS inverter is known to have the great advantages that its power consumption is small; amplification is effected at a high rate when the inverter is shifted from one output state to another; and said shifting takes a very short time.

As apparent from FIG. 2, however, a P channel transistor $T_P$ and an N channel transistor $T_N$ are formed on the same substrate (shown to have an N conductivity type), making it necessary to provide an isolation region between both transistors $T_P$, $T_N$ (between the drains of said transistor $T_P$, $T_N$ as indicated). Therefore, integration of the prior art CMOS involves more complicated processing steps than that of the customary single channel MOS transistor, thus obstructing the elevation of integration density.

It is accordingly the object of this invention to provide CMOS transistors, wherein part of that portion of a semiconductor region in which a P channel MOS transistor is formed and part of that portion of a semiconductor region in which an N channel MOS transistor is formed constitute a common section of both MOS transistors, thereby making it unnnecessary to provide an isolation region therebetween.

SUMMARY OF THE INVENTION

The CMOS transistors of this invention comprise one of semiconductor substrate and a semiconductor region provided on an insulating substrate, which includes a first semiconductor region of a first conductivity type and a second semiconductor region of a second conductivity type formed adjacent to the first semiconductor region; a third semiconductor region of the second conductivity type provided on the first semiconductor region; a fourth semiconductor region of the first conductivity type provided on the second semiconductor region; a first channel region formed between the first semiconductor region and the fourth semiconductor region and having a subregion with a prescribed conductivity type having a specified impurity concentration; a second channel region formed between the second semiconductor region and the third semiconductor region and having a subregion with a prescribed conductivity type having a specified impurity concentration; a fifth semiconductor region of the second conductivity type provided in a portion of the first channel region and adjacent to the subregion of the second channel region; a sixth semiconductor region of the first conductivity type formed in a portion of the second channel region and adjacent to the subregion of the first channel region; and gate electrode means positioned above the first and second channel regions through an insulation layer.

An MOS transistor of the first channel type of the complementary MOS transistor includes the fourth semiconductor region, the subregion of the first channel region and the sixth semiconductor region. An MOS transistor of the second channel type of the complementary MOS transistor includes the third semiconductor region, the subregion of the second channel region and the fifth semiconductor region.

According to this invention, the channel region of an MOS transistor of one channel type is concurrently used as the source or drain of an MOS transistor of the opposite channel type. Further, a gate electrode is formed above the first and second channel regions to be used in common thereto. Therefore, the MOS transistors of the first and second channel types are integrally formed as if to assume the form of a single element, making it unnecessary to provide an isolation region therebetween, and consequently ensuring the elevation of integration density.

DETAILED DESCRIPTION OF THE PREFERRED EMBODIMENTS

Figure 3A:
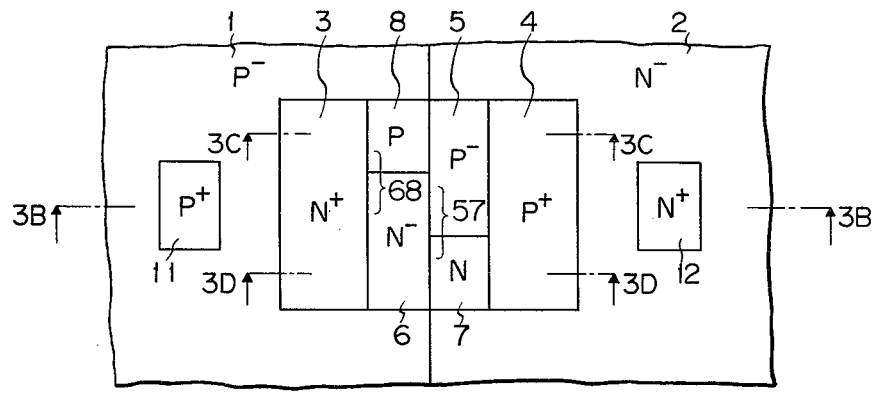
FIG. 3A is a schematic plan view of the arrangement of the semiconductor regions included in the CMOS transistor according to this invention.
Figure 3B:
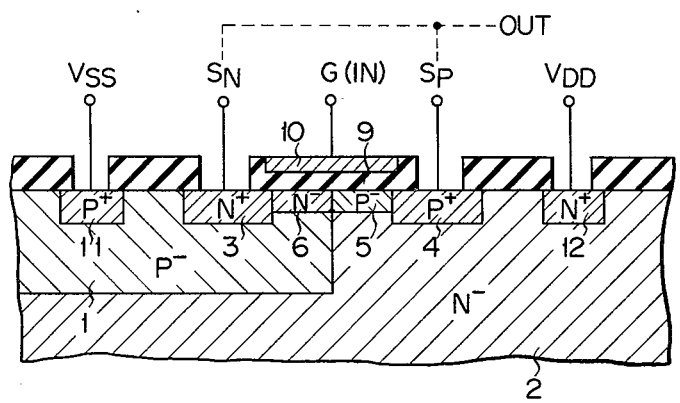
FIG. 3B is a sectional view on line 3B—3B of FIG. 3A.
Figure 3C:
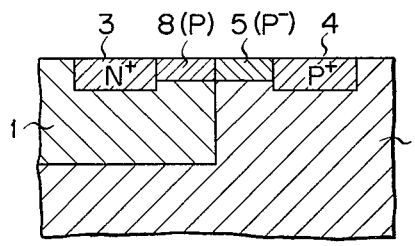
FIG. 3C is a sectional view on line 3C—3C of FIG. 3A.
Figure 3D:
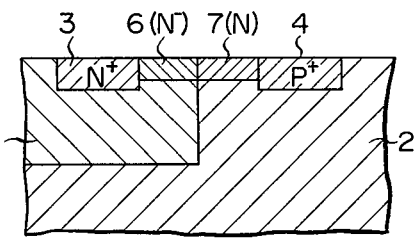
FIG. 3D is a sectional view on line 3D—3D of FIG. 3A.
Figure 4:
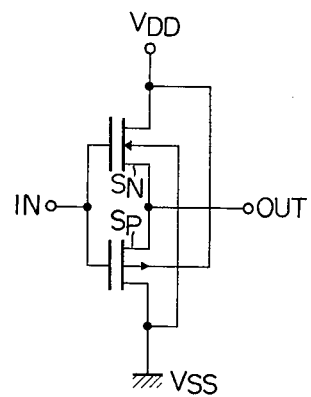
FIG. 4 is an equivalent circuit diagram of a gate using the CMOS of the invention.
Figure 5:
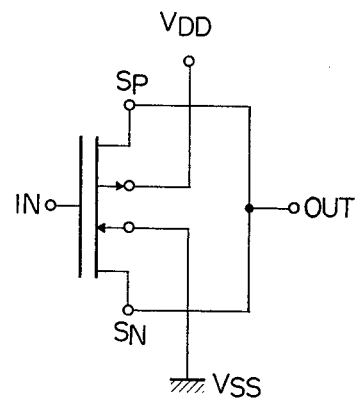
FIG. 5 is an equivalent circuit diagram, showing the two MOS transistor of FIG. 4 integrated into a single element.

FIGS. 3A, 3B, 3C and 3D collectively show an embodiment of this invention in which depletion-depletion type CMOS transistor are formed by the method of the invention. According to the method of the invention, a P type first region 1 doped with an impurity at a low concentration (hereinafter referred to as a "P-type") is formed on an N type semiconductor substrate doped with an impurity similarly at a low concentration (hereinafter referred to as an "N⁻ type"0. That region of the N⁻ type semiconductor substrate which lies adjacent to the first P⁻ type region 1 is referred to as "a second region 2". Formed on the first P⁻ type region 1 is a third semiconductor region 3 doped with an impurity at a high concentration (hereinafter referred to as an "N+ type "). Formed on the second N⁻ type region 2 is a p type fourth region 4 doped with an impurity at a high concentration (hereinafter referred to as a "P+ type"). The third region 3 is used as a source $S_N$ of an N channel MOS transistor. The fourth region 4 is applied as a source $S_P$ of a P channel MOS transistor. A first channel region 57 consisting of a subregion 5 of P⁻ type and a fifth semiconductor region 7 of N type is formed between the first region 1 and fourth region 4. A second channel region 68 formed of a subregion 6 of N⁻ type and a sixth semiconductor region 8 of P type is provided between the second semiconductor region 2 and the third semiconductor region 3. The fifth semiconductor region 7 of the first channel region 57 concurrently acts as the drain of an N channel MOS transistor. The sixth semiconductor region 8 of the second channel region 68 concurrently acts as the drain of a P channel MOS transistor. As shown in FIG. 3A, both N- and P- channel MOS transistors are rendered of the depletion type by causing the subregion 5 of the first channel region 57 to have a P⁻ type and the subregion 6 of the second channel region 68 to have an N⁻ type. The subregions 5 and 6, fifth and sixth semiconductor regions of the first and second channel regions 57, 68 have relative positions indicated in FIGS. 3C and 3D. The third semiconductor region 3, the subregion 6 and the fifth semiconductor region 7 are used with an N channel MOS transistor. The forth semiconductor region 4, the subregion 5 and the sixth semiconductor region 8 are used with a P type MOS transistor. A common gate electrode 10 is provided above the first channel region 57 and the second channel region 68 through a gate insulation layer (FIG. 3B).

Where the CMOS transistor of this invention having the regions and subregions of FIG. 3A is used as a noninverted type gate, then the common gate electrode 10 is applied as an input terminal IN. The source $S_P$ of the P channel MOS transistor and the source $S_N$ of the N channel MOS transistor are connected together to be used as an output terminal OUT, as indicated in a broken line. The drain 7 (fifth semiconductor region) of the N channel MOS transistor is connected to the first power source $V_{DD}$ (for example, +5 V) through an N+ region 12 formed on the surface of the second semiconductor region 2. The drain 8 (sixth semiconductor region) of the P channel MOS transistor is connected to the second power source $V_{SS}$ (for example, zero V) through a P+ region 11 formed on the surface of the first semiconductor region 1. As the result, there is provided a D/D type CMOS noninverted type gate.

We will now discuss again the arrangement of FIG. 3A. For the reason previously given, provision of the N type fifth region 7 in the first channel region 57 and the P type sixty region 8 in the second channel region 68 is necessary, where a D/D type CMOS transistor is formed. Further where one of the MOS transistors is made into an enhancement (E) type and the other into a depletion type (D), and also where both transistors are made into an E type CMOS transistor, provisions of the fifth region 7 and the sixth region 8 are required. The reason for this is as follows. Where the fifth region 7 is doped with an impurity at a higher concentration than in the second region 2 and subregion 5, and the six region 8 is doped with an impurity at a higher concentration than in the first region 1 and subregion 6. Then it is possible to decrease the resistances of the drains of the N- and P-type MOS transistors.

According to the embodiment of FIGS. 3A and 3B, both MOS transistors were made into the D type. Where, however, the N type MOS transistor is made into the E type, it is advised to change the subregion 6 into a P⁻ type. Where the P type MOS transistor is made into the E type, it is advised to change the subregion 5 into the N⁻ type. Where the subregion 6 of the second channel region 68 is made into the P⁻ type, it is possible to use the first region 1 itself as the subregion 6. Where the subregion 5 of the first channel region 57 is made into the N⁻ type, it is possible to use the second region 2 itself as the subregion 5. As mentioned above, both MOS transistors can be made into the E and D types respectively or into the E and E types respectively, as need arises.

Where, with the embodiment of FIGS. 3A and 3B, another depletion type N channel MOS transistor $T_2$ is provided between the source $S_N$ of the N channel MOS transistor and the source $S_P$ of the p channel MOS transistor, then it is possible to form the MOS transistors $T_1$, $T_2$, $T_3$ of the memory cell previously described by reference to FIG. 1 into an integral body.

Figure 1:
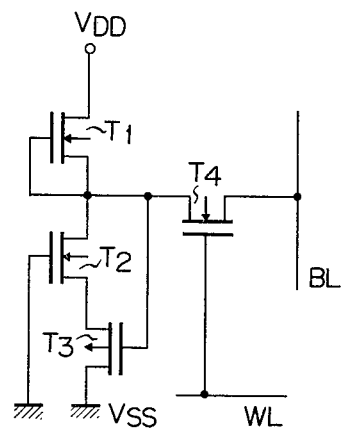
FIG. 1 is an equivalent circuit diagram of the prior art static memory cell.
Figure 2:
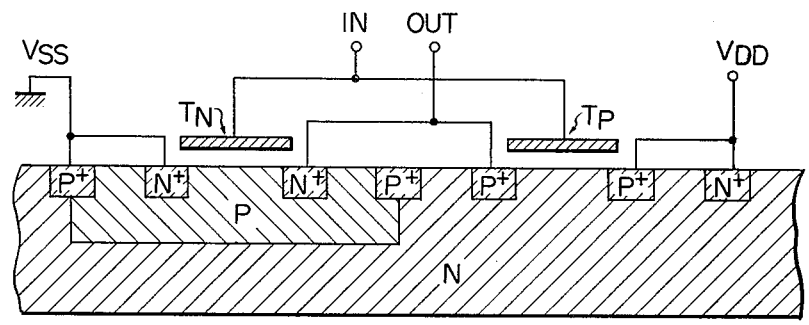
FIG. 2 schematically shows the section of the prior art CMOS inverter.
Figure 6:
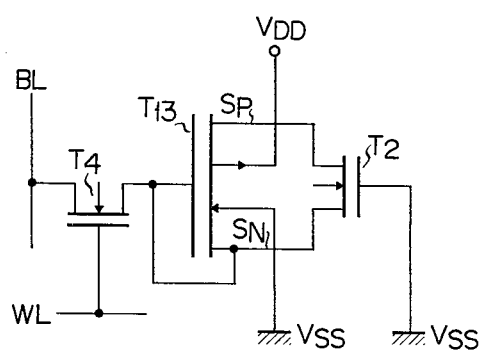
FIG. 6 is an equivalent circuit diagram of the memory cell of FIG. 1 using the CMOS transistor of the invention.

FIG. 6 is an equivalent circuit diagram of a memory cell using a CMOS transistor according to this invention and corresponding to FIG. 1 which includes an MOS transistor $T_4$ acting as a transfer gate. Referring to FIG. 6, a second depletion type N channel MOS transistor $T_2$ is connected between the source $S_P$ of the P channel MOS transistor and the source $S_N$ of the N channel MOS transistor. The gate of the second depletion type N channel MOS transistor $T_2$ is connected to the second power source $V_{SS}$. As seen from FIG. 3A, the MOS transistors $T_1$, $T_3$ of FIG. 1 are integrated into a single transistor $T_{13}$. The drain of the N channel MOS transistor $T_1$ is connected to the first power source $V_{DD}$ and the drain of the P channel MOS transistor $T_3$ is connected to the second power source $V_{SS}$. One of the electrodes of the MOS transistor $T_4$ acting as a transfer gate is connected to the common gate and source $S_N$ of the integrated transistor $T_{13}$. The other electrode of the MOS transistor $T_4$ is connected to the bit line BL, and the gate electrode thereof is connected to the word line WL.

Figure 7:
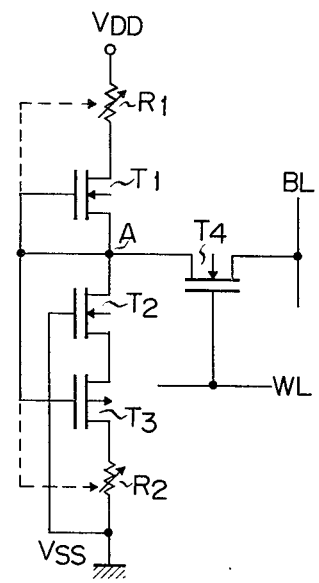
FIG. 7 is another equivalent circuit diagram of the memory cell of FIG. 1 using the CMOS transistor of the invention, showing the property of the memory cell.

The memory cell of FIG. 6 can be integrated with a higher density and also display a more excellent effect than the prior art memory cell of FIG. 1. The reason for this is as follows. Where the construction of the channel regions occupied by the CMOS transistor of this invention is closely examined, the equivalent circuit of FIG. 6 may be regarded as the equivalent circuit of FIG. 7. According to the equivalent circuit of FIG. 7, a variable resistor $R_1$ whose resistance is controlled by the gate voltage of the MOS transistors $T_1$, $T_3$ is connected between the drain of the MOS transistor $T_1$ and the first power source $V_{DD}$. A variable resistor $R_2$ whose resistance is controlled by said gate voltage is connected between the drain of the MOS transistor $T_3$ and the second power source $V_{SS}$. The above-mentioned resistance variations are explained from the fact that a channel region whose conductivity varies with the aforesaid gate voltage is used as a drain region. Provision of the resistors $R_1$, $R_2$ offers the following operation advantages.

As is well known, the MOS transistors $T_2$, $T_3$ indicate negative resistance. Where a potential at point A (FIG. 7) rises over a sum of the absolute values of the threshold voltages of the MOS transistors $T_1$, $T_2$, then current ceases to flow through the circuits of the MOS transistors $T_2$, $T_3$. This means that a potential at point A has two stability phases defined by a value of current running through the MOS transistor $T_1$. One of said two stability phases represents a potential approximating the voltage of the second power source $V_{SS}$. The other stability phase denotes a potential approaching the voltage of the first power source $V_{DD}$. The power consumption of a memory cell at the stability point A representing a potential approximating the voltage of the first power source $V_{DD}$ is extremely small, because it is defined by the leakage current of the MOS transistors $T_2$, $T_3$ which remain nonconducting. At the stability point denoting a potential approaching the voltage of the second power source $V_{SS}$, the memory cell consumes a relatively large amount of power. The reason is that since the MOS transistors $T_2$, $T_3$ are rendered conducting, the current conducted through the memory cell is generally defined by the current running through the MOS transistor $T_1$. As seen from FIG. 3A, the subregion 5 of the first channel region 57 is of the P$^-$ type, and the fifth region 7 alone acts as the drain of P$^-$ MOS transistor $T_1$, causing the resistor $R_1$ of FIG. 7 to have a large equivalent resistance. Therefore, current running through the resistor $R_1$ and MOS transistor $T_1$ is decreased. When a memory cell has a stabilized condition represented by the stability point A denoting a potential approximating the voltage of the first power source $V_{DD}$, the gate of the MOS transistor $T_1$ is impressed with voltage approximating the voltage of the first power source $V_{DD}$. Accordingly, the subregion 5 is inverted into the N type. Since a substantially large area acts as the drain of the MOS transistor $T_3$, the resistor $R_1$ decreases in resistance, causing a potential at the stability point A closely to approach the voltage of the first power source $V_{DD}$.

Figure 8:
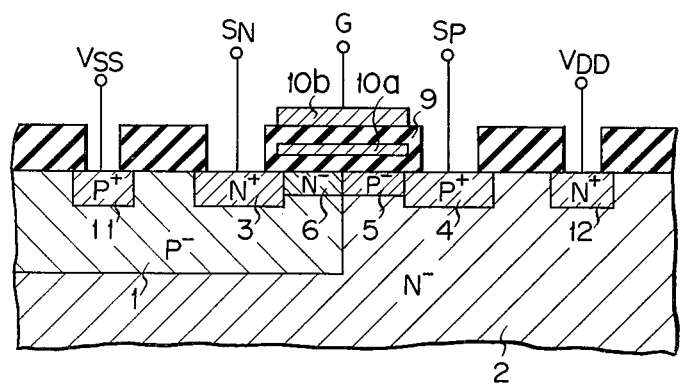
FIG. 8 is a sectional view of the CMOS transistor of the invention used as an electrically programmable read only memory (EPROM)

The CMOS transistor of this invention can be used with an electrically programmable read only memory (EPROM). FIG. 8 is a section view of the CMOS transistor thus applied on line 3B—3B of FIG. 3A. The embodiment of FIG. 8 differs from that of FIG. 3 in that a floating gate 10a is embedded in an insulation layer 9 deposited over the first and second channel regions, and an outermost gate electrode 10b is formed on the insulation layer 9.

When the outermost gate electrode 10b is impressed with negative voltage and a reversed bias voltage is applied between the first region 1 and third subregion 3 to give rise to avalanche breakdown, then holes are introduced into the floating gate 10a. When the outermost gate electrode 10b is supplied with possitive voltage and a reversed bias voltage is impressed between the second region 2 and fourth region 4, then electrons can be supplied to the floating gate 10a. Since the threshould voltages of the N- and P- channel MOS transistors vary with an electric charge trapped by the floating gate 10a, the electric charge of the floating gate 10a can be determined from the threshould voltage of either of the N- and P- channel MOS transistors. The floating gate electrode 10a need not be a conductor, but is only required to trap an electric charge.

Figure 9:
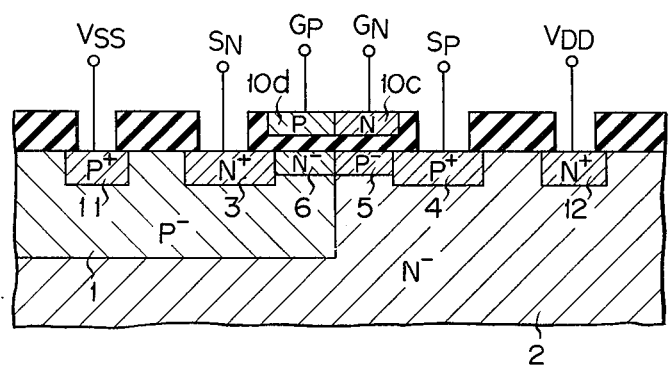
FIG. 9 is a sectional view of a modification of the CMOS transistor of the invention shown in FIGS. 3A and 3B.

Referring to the embodiment of FIG. 3B, the gate electrode 10 need not be made of metal, but can be formed of a semiconductor. In this case, an N conductivity type semiconductor gate electrode 10C and gate terminal $G_N$ are formed above the first channel region 57. A P conductivity type semiconductor gate electrode 10d and gate terminal $G_P$ are provided above the second channel region 68. As seen from FIG. 9, the gate electrodes 10c, 10d are arranged adjacent to each other. Under this arrangement, voltage impressed on the gate terminal $G_P$ can independently control the gate voltages of the MOS transistors in a lower range of voltage level than the voltage applied to the gate terminal $G_N$. With the embodiment of FIG. 9, the gate electrodes 10c, 10d are respectively of the N and P types. But the conductivity types of these gate electrodes 10c, 10d may be reversed to the P and N conductivity types.

Figure 10A:
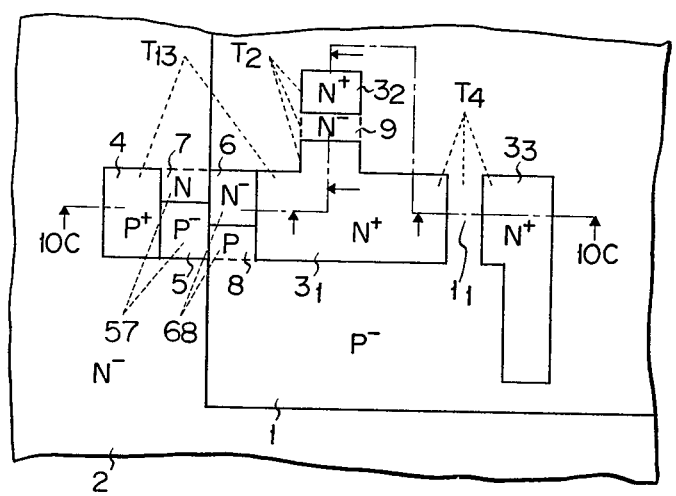
FIG. 10A is a plan view of the arrangement of semiconductor regions when a memory cell shown in FIG. 1 is constructed by using the CMOS transistor according to this invention.

We have roughly described by reference to FIG. 6 the process of manufacturing a memory cell from the CMOS transistors of this invention in the form similar to the prior art memory cell of FIG. 1. The concrete arrangement of the present memory cell will now be described by reference to FIGS. 10A, 10B, and 10C. The regions 1, 2, 4, 7, 8 and subregions 5, 6 of FIG. 10A are respectively denoted by the same reference numeral as those of FIG. 3A, description thereof being omitted. In FIG. 10A, the third regions 3 of FIG. 3 is denoted by a reference numeral $3_1$. The first region 1 comprises a seventh N$^+$ type region $3_2$ and an eighth N type region 9 positioned adjacent thereto. The eighth region 9 contacts the third region $3_1$. The third region $3_1$, eighth region 9 and seventh region $3_2$ collectively constitute an N channel MOS transistor $T_2$ of FIG. 1. The first region 1 of FIG. 10A further includes a ninth N$^+$ type region $3_3$. The third N$^+$ type region $3_1$, first P$^-$ type region 1 and ninth N+ type region $3_3$ jointly form a fourth N channel MOS transistor $T_4$ of FIG. 1. A gate electrode $10_1$ (FIG. 10B) formed above the first and second channel regions through an insulation layer is electrically connected to the third region $3_1$. The fourth region 4 and seventh region $3_2$ are electrically connected to each other by a line $11_1$. A gate electrode $10_3$ provided through an insulation layer above a gate region formed between the third region $3_1$ and ninth region $3_3$ is connected to a word line WL $11_2$. The gate electrode $10_2$ of the second MOS transistor $T_2$ is connected to the first region 1. It will be noted that a gate electrode $10_1$ is not connected to the word line WL. The ninth region $3_3$ is connected to bit lines $11_3$, $11_4$. The first region 1 is connected to the second power source $V_{SS}$ through a line $11_5$. The second region 2 is connected to the first power source $V_{DD}$ through a line $11_6$.

Figure 10B:
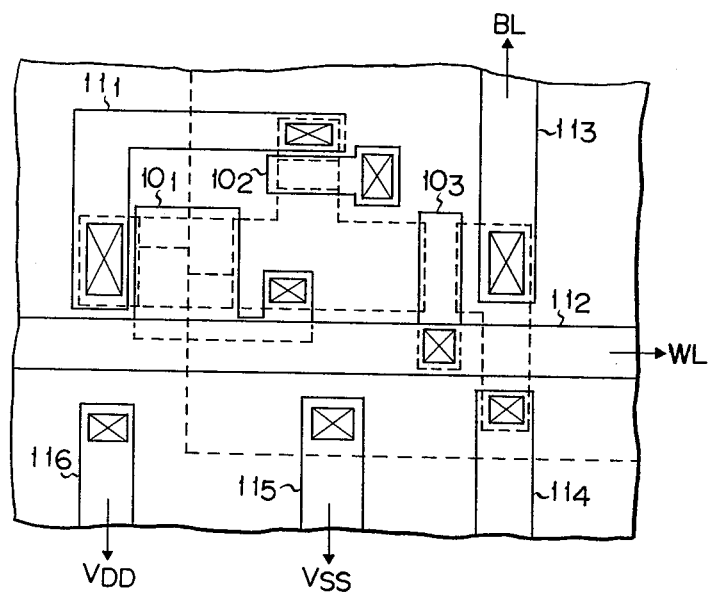
FIG. 10B is a plan view of the circuit arrangement of the semiconductor regions of FIG. 10A.
Figure 10C:
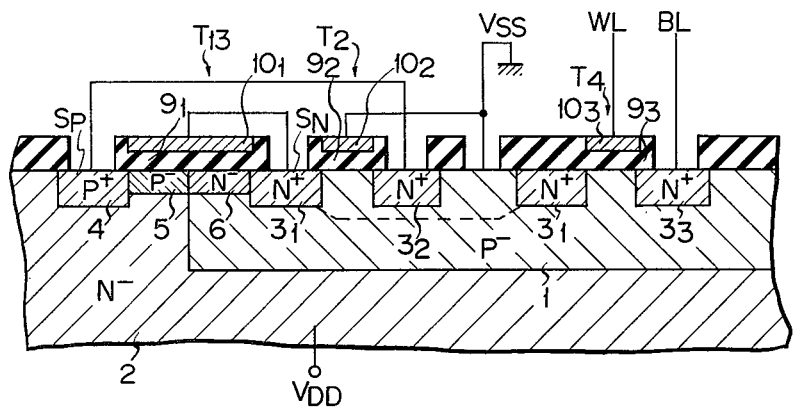
FIG. 10C is a sectional view on line 10C—10C of FIG. 10A, as taken in the direction of the indicated arrow.

For better understanding of this invention, FIG. 10c shows the section of a memory cell on line 10c–10c of FIG. 10A by linearly arranging the integral by combined transistor $T_{13}$ and MOS transistors $T_2$, $T_4$. The elements of FIG. 10C the same as those of FIGS. 10A and 10B are respectively denoted by the same reference numeral, description thereof being omitted. However, a reference numeral $9_1$ shows a gate insulation layer formed on the first and second channel regions of the integrally combined transistor $T_{13}$; $9_2$ a gate insulation layer mounted on the channel region of the second MOS transistor $T_2$; and $9_3$ a gate insulation layer provided on the channel region of the transistor $T_4$. The second and fourth MOS transistors $T_2$, $T_4$ have a common third region $3_1$ defined by a broken line. The first power source $V_{DD}$ is impressed with voltage of, for example, +5V, and the second power source $V_{SS}$ with voltage of, for example zero V.

Figure 11:
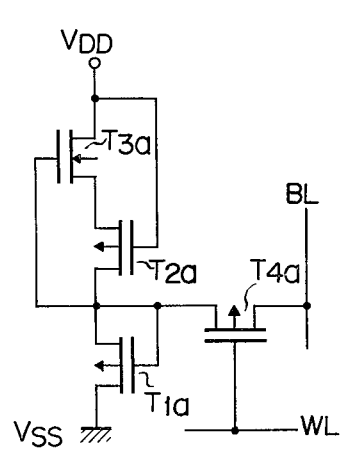
FIG. 11 is another equivalent circuit diagram of a memory cell falling outside of the invention which is formed of MOS transistors, some of which have a channel type opposite to the corresponding MOS transistors used with the memory cell of FIG. 1.

FIG. 11 shows the arrangement of a memory cell which comprises a P channel MOS transistor $T_{1a}$ whose drain is connected to the second power source $V_{SS}$ to be used for a load; an N channel MOS transistor $T_{3a}$ whose drain is connected to the first power source $V_{DD}$; a P channel MOS transistor $T_{2a}$ connected between the source of the MOS transistor $T_{1a}$ and that of the MOS transistor $T_{3a}$; and a P channel MOS transistor $T_{4a}$ which is connected between the junction of the MOS transistor $T_{1a}$ and MOS transistor $T_{2a}$, and the bit line BL. The gate of the MOS transistor is connected to the word line WL. The MOS transistors $T_{1a}$ and $T_{3a}$ of the above-mentioned memory cell can be formed of the CMOS transistor of this invention.

Figure 12:
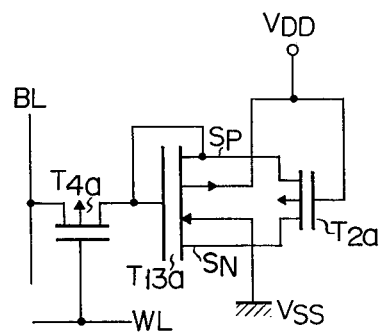
FIG. 12 is an equivalent diagram of a memory cell having a type similar to that of FIG. 11 and consisting of the CMOS transistor of the invention.

FIG. 12 is an equivalent circuit of a memory cell, in which the MOS transistors $T_{1a}$, $T_{3a}$ of FIG. 11 consist of the CMOS transistor of the invention. The memory cell of FIG. 12 is operated theoretically in the same manner as a memory cell represented by the equivalent circuit of FIG. 6, further description thereof being omitted.

All the foregoing embodiments refer to the case where elements were formed on an N type semiconductor substrate.

However, it is possible to form elements conversely on a P type semiconductor substrate or on a semiconductor region formed on an insulation type substrate like that of sapphire.

What is claimed is:

1. A complementary metal-oxide-semiconductor (MOS) transistor comprising one of a semiconductor substrate and a semiconductor region provided on an insulating substrate, which includes a first semiconductor region of a first conductivity type and a second semiconductor region of a second conductivity type formed adjacent to said first semiconductor region; a third semiconductor region of the second conductivity type provided on said first semiconductor region; a fourth semiconductor region of the first conductivity type provided on said second semiconductor region; a first channel region formed between said first semiconductor region and said fourth semiconductor region and having a subregion with a prescribed conductivity type having a specified impurity concentration; a second channel region formed between said second semiconductor region and said third semiconductor region and having a subregion with a prescribed conductivity type having a specified impurity concentration; a fifth semiconductor region of the second conductivity type provided in a portion of said first channel region and adjacent to the subregion of said second channel region; a sixth semiconductor region of the first conductivity type formed in a portion of said second channel region and adjacent to the subregion of said first channel region; and gate electrode means positioned above said first and second channel regions through an insulation layer for controlling said first and second channel regions; an MOS transistor of the first channel type of said complementary MOS transistor including said fourth semiconductor region, the subregion of said first channel region and said sixth semiconductor region; an MOS transistor of the second channel type of said complementary MOS transistor including said third semiconductor region, the subregion of said second channel region and said fifth semiconductor region.

2. The complementary MOS transistor according to claim 1, which is of the depletion-depletion type, in which said first conductivity type is the P type; said second conductivity type is the N type; said third region is of the N type and is doped with an impurity at a high concentration; said fourth region is of the P type and is doped with an impurity at a high concentration; first channel region includes a P type subregion doped with an impurity at a lower concentration, and a fifth N type region doped with an impurity at a concentration intermediate between the concentrations at which said third region and said subregion of the second channel region are doped with an impurity; and said second channel region includes an N type subregion doped with an impurity at a low concentration and a sixth P type region doped with an impurity intermediate between the concentrations at which said fourth region and said subregion of the first channel region are doped with an impurity.

3. The complementary MOS transistor according to claim 1, which is of the enhancement-enhancement type, in which said first conductivity type is the P type; said second conductivity type is the N type; said third region is of the N type and is doped with an impurity at a high concentration; said fourth region is of the P type and is doped with an impurity at a high concentration; said first channel region includes an N type subregion doped with an impurity at a low concentration and a fifth N type region doped with an impurity at a concentration intermediate between the concentrations at which said third region and the subregion of said first channel region are doped with an impurity; and said second channel region includes a P type subregion doped with an impurity at a low concentration and a sixth P type region doped with an impurity at a concentration intermediate between the concentrations at which the fourth region and the subregion of said second channel region are doped with an impurity.

4. The complementary MOS transistors according to claim 1, wherein the gate electrode means includes a common gate electrode formed above said first and second channel regions through an insulation layer.

5. The complementary MOS transistors according to claim 1, wherein the gate electrode means includes a common floating gate electrode embedded in an insulation layer formed on said first and second channel regions; and a common outermost gate electrode provided on said insulation layer.

6. The complementary MOS transistors according to claim 1, wherein the gate electrode means includes a first electrode provided above said first channel region through an insulation layer and supplied with a first gate signal, and a second electrode fromed above said second channel region through an insulation layer and supplied with a second gate signal; and said first and second electrodes are formed of semiconductor elements with the opposite conductivity types, and are arranged in an integral form.

7. The complementary MOS transistors according to claim 1, wherein said fourth region is formed in said second region, said second region being connected to said first power source through a region of the second conductivity type which is doped with an impurity at a concentration higher than that at which the fourth region is doped with an impurity; said third region is formed in said first region, said first region being connected to said second power source through a region of a first conductivity type which is doped with an impurity at a concentration higher than that at which said first region is doped with an impurity; said gate electrode means includes a common electrode placed above said first and second channel regions through an insulation layer, said common gate electrode being connected to an input terminal; and said third and fourth regions are connected to a common output terminal.

8. The complementary MOS transistors according to claim 1, wherein a first MOS transistor is formed on said first region, which includes said third region, a seventh semiconductor region of the second conductivity type which is formed on said first region and doped with an impurity substantially at the same concentration as that at which said third region is doped with an impurity, and an eighth region provided between said third and seventh regions and doped with an impurity at a concentration lower than that at which the seventh region is doped with an impurity; a second MOS transistor is constituted on said first region, which includes said third region, a ninth semiconductor region of the second conductivity type which is formed on said first region and doped with an impurity at a concentration substantially the same as that at which said third region is doped with an impurity, and said first region lying between said third and ninth regions; a gate electrode positioned above said first and second channel region through an insulation layer is connected to said third region; the gate electrode of said first MOS transistor is connected to said first region; said fourth semiconductor region is connected to said seventh semiconductor region; the gate electrode of said second MOS transistor is connected to a word line; said ninth region is connected to a bit line; said second region is connected to a first power source; and said first region is connected to a second power source.

9. A semiconductor memory device, which comprises a first metal-oxide-semiconductor (MOS) transistor of a second channel type, one terminal of which is connected to a first power source; a third MOS transistor of a first channel type, one terminal of which is connected to a second power source; a second MOS transistor of a second channel type which is connected between the other terminal of said first MOS transistor and the other terminal of said third MOS transistor; and a fourth MOS transistor which is connected between the junction of said first and second MOS transistors and a bit line and whose gate electrode is connected to a word line, and in which the gate electrodes of said first and third MOS transistors are connected to the junction of said first and second MOS transistors and the gate electrode of said second MOS transistor is connected to said second power source, and wherein said first and third MOS transistors are made into a complementary MOS transistor without an isolation region between said two MOS transistors, said complementary MOS transistor comprising a semiconductor substrate including a first region of a first conductivity type and a second region of a second conductivity type which is set adjacent to said first region; a third region of the second conductivity type which is formed on said first region; a fourth region of the first conductivity type which is formed on said second region; a first channel region formed between said first region and fourth region and having a subregion with a prescribed conductivity type having a specified impurity concentration; a second channel region formed between said second region and third region and having a subregion with a prescribed conductivity type having a specified concentration; a fifth region of the second conductivity type provided in a portion of said first channel region and adjacent to the subregion of said second channel region; a sixth region of the first conductivity type formed in a portion of said second channel region and adjacent to the subregion of said first channel region; and gate electrode means provided above said first and second channel regions through an insulation layer for controlling said first and second channel regions; an MOS transistor of the first channel type of said complementary MOS transistor including said fourth region, the subregion of said first channel region and said sixth region; an MOS transistor of the second channel type of said complementary MOS transistor including said third region, the subregion of said second channel region and said fifth region.

10. The semiconductor memory device according to claim 9, wherein said second MOS transistor includes said third region, a seventh region of the second conductivity type which is formed in said first region and an eighth region of the second conductivity type which is formed in said first region between said third and seventh regions and is doped with an impurity at a specified concentration; and said fourth MOS transistor includes said third region, a ninth region of the second conductivity type which is formed on said first region, and a tenth region having the same conductivity type and impurity concentration as said first region lying between said third and ninth regions.

* * * * *